US012718081B2

(12) United States Patent
Wang et al.

(10) Patent No.: US 12,718,081 B2
(45) Date of Patent: Aug. 25, 2026

(54) NEURON METAL OXIDE SEMICONDUCTOR DEVICES AND CIRCUITS FABRICATED WITH CMOS LOGIC PROCESS TECHNOLOGY

(71) Applicant: FlashSilicon Incorporation, Diamond Bar, CA (US)

(72) Inventors: Lee Wang, Diamond Bar, CA (US); Jeffrey Wang, Diamond Bar, CA (US)

(73) Assignee: FLASHSILICON INCORPORATION, Diamond Bar, CA (US)

( * ) Notice: Subject to any disclaimer, the term of this patent is extended or adjusted under 35 U.S.C. 154(b) by 644 days.

(21) Appl. No.: 18/214,175

(22) Filed: Jun. 26, 2023

(65) Prior Publication Data

US 2024/0428062 A1 Dec. 26, 2024

(51) Int. Cl.
*G06N 3/065* (2023.01)
*H03K 19/0185* (2006.01)
*H10D 30/68* (2025.01)

(52) U.S. Cl.
CPC ..... *G06N 3/065* (2023.01); *H03K 19/018521* (2013.01); *H10D 30/68* (2025.01)

(58) Field of Classification Search
None
See application file for complete search history.

(56) References Cited

U.S. PATENT DOCUMENTS

| | | | | |
|---|---|---|---|---|
| 5,917,742 | A * | 6/1999 | Ohmi | G06N 3/063 708/801 |
| 6,704,757 | B1 * | 3/2004 | Ohmi | G06N 3/065 708/3 |
| 2002/0105833 | A1 * | 8/2002 | Aoyama | G06F 15/7867 365/185.24 |
| 2013/0273664 | A1 * | 10/2013 | Toumazou | G01N 27/4148 257/253 |
| 2023/0113627 | A1 * | 4/2023 | Kim | G06N 3/065 706/34 |

OTHER PUBLICATIONS

Shibata et al., "An Intelligent MOS Transistor Featuring Gate-Level Weighted Sum and Threshold Operations," p. 99 of International Electron Devices meeting (IEDM) 1991, 4 pages.

G. Cybenko, "Approximation by superpositions of a sigmoidal function," Mathematics of Control, Signals, and Systems, 1989, 2 (4), pp. 303-314, 13 pages.

* cited by examiner

*Primary Examiner* — Jany Richardson
(74) *Attorney, Agent, or Firm* — MUNCY, GEISSLER, OLDS & LOWE, P.C.

(57) ABSTRACT

The neuron Logic Gate Metal-Oxide-Semiconductor (vLGMOS) circuits to mimic neurons' "integrate-and-fire" behaviors in biological neural network system can be fabricated with industry Complementary Metal-Oxide Semiconductor (CMOS) logic process technology, with which digital computational circuits are fabricated. A processing system having analog vLGMOS circuits, conversion circuitry and digital circuits optimized for power and cost for varieties of applications can be then fabricated with the same CMOS logic process technology for IC chips. Meanwhile analog vLGMOS circuits inspired from biological neural network systems can be simulated, designed, and fabricated for IC chips for the applications of biomedical fields.

13 Claims, 14 Drawing Sheets

| $V_A$ | $V_B$ | $V_C$ | Logic Op. |
|---|---|---|---|
| $V_{DD}$*1/4 | $V_{DD}$*1/4 | $V_{DD}$ | $\overline{XOR}$ |
| $V_{DD}$*3/4 | $V_{DD}$*3/4 | 0 | XOR |
| 0 | 0 | $V_{DD}$ | OR |
| $V_{DD}$ | $V_{DD}$ | 0 | AND |

Inhibitory νLGNMOS device with a pull-up loading element

Inhibitory vLGPMOS device with a pull-down loading element

Excitatory vLGCMOS circuit

NEURON METAL OXIDE SEMICONDUCTOR DEVICES AND CIRCUITS FABRICATED WITH CMOS LOGIC PROCESS TECHNOLOGY

BACKGROUND OF THE INVENTION

Field of the Invention

The invention relates to neuron Metal Oxide Semiconductor Field Effect Transistor (νMOSFET) circuits for emulating biological neural circuits in analog signal processing. In particular, since neuron circuits can be designed and fabricated with industry standard Complementary Metal Oxide Semiconductor (CMOS) logic process technology, the information processors with analog neuron circuits and digital computational circuits optimizing for high processing efficiency can be realized for the Integrated Circuit (IC) chips.

Description of the Related Art

FIG. 1(*a*) shows a schematic of a conventional neuron MOSFET (Metal Oxide Semiconductor Field Effect Transistor) device disclosed in "An intelligent MOS transistor featuring gate-level weighted sum and threshold operations," by Shibata et. al. (page 99 of International Electron Devices meeting (IEDM) 1991). FIG. 1(*b*) shows equivalent floating gate capacitances of the conventional neuron MOSFET device in FIG. 1(*a*). The voltage potential $\phi_f$ for the floating-gate of the neuron MOSFET device is given by $Ø_f=(C_1V_1+ \ldots +C_nV_n)/C_t$, and, $C_t=C_1+ \ldots +C_n$, where $\phi_f$ is the voltage potential of the conducting floating-gate 110, $(C_1, C_2, \ldots, C_n)$ are the capacitances of the input gates 120 with the conducting floating gate 110, and $(V_1, V_2, \ldots, V_n)$ are the applied voltages for the input gates 120.

The neuron MOSFET device 100 is turned on by the conducting floating-gate voltage potential $\phi_f$ over the device's threshold voltage by the integral of plural input voltages weighted by the individual coupling capacitances as shown in the above equations. Since a biological neuron is also activated (turned-on) by the gradient voltage potential (similar to the conducting floating-gate voltage potential of the neuron MOS device 100) over the neuron's threshold voltage (~tens milli-volts for neurons) generated by the integrals of neural transmitter signals (similar to the input voltage signals of the neuron MOS device 100) to its multiple post-synapses (similar to the multiple input gates 120 of the νMOS device 100) with various synaptic strengths (similar to the input gate coupling capacitances of the neuron MOS device), the neuron MOSFET device or νMOS device in short, called by the inventors can emulate the electrical activation (integrate-and-fire) behavior of a neuron.

According to the "integrate-and-fire" neuron firing model, a neuron with multiple post-synapses (signal receptors) can have either "any strong" post-synapses strong enough to fire or have "all weak" post-synapses strong enough to fire. In term of mathematical concept of logic gates, the former can be considered as the "OR" gate function as for the "any strong" inputs to turn on (to fire), while the latter can be considered as the "AND" gate function as the "all weak" inputs to turn on (to fire). Along with the same analogy a neuron applies its "integrate-and-fire" function to "analogically and logically" analyze the input neural signals from its multiple post-synaptic inputs with various strengths of synaptic connections. Similarly, νMOS circuits comprising the circuit networks of multiple νMOS devices with various capacitor coupling strengths (weights) to perform the "integrate-and-fire" functions, "analogically and logically" analyze the multiple inputted analog voltage signals for the output analog voltage signal(s) according to their circuit configurations.

FIG. 2(*a*) is a schematic diagram of a νMOS circuit according to prior art. FIG. 2(*b*) show the relationship among external control signal voltages ($V_A$, $V_B$ and $V_C$) and different logic functions for input gate voltages ($I_1$ and $I_2$). The νMOS circuit 200 includes a 2-bit D/A converter 210 and a neuron circuit 220 having a four-input νMOS inverter 221 and an ordinary inverter 222. In the above disclosure, Shibata et. al. further applied the νMOS devices 100 for the νMOS circuit 200 shown in FIG. 2(*a*) to demonstrate the "variable" logic gate functions in FIG. 2(*b*) for the digital logic gates such as AND, OR, and XOR gates by varying the circuit amplifiers' reference voltages with a fixed circuit input coupling capacitor ratio of (8:4:2:1) for the 4-input νMOS inverter 221. The demonstration indicates that the variations of reference voltages ($V_A$, $V_B$, $V_C$), input voltages ($V_1$, $V_2$, $V_3$, $V_4$), and coupling strengths for the νMOS circuit 200 can alter the circuit logic functionality. Similarly, the neuron firing behavior is mostly controlled by the strengths of input neural transmitter signals from the post-synaptic connections. While the physical alterations of synaptic strengths or formations of new synapses for a neuron can be achieved by frequently applying stimulus to the specific location in the biological neutral network systems from the training exercises according to the neural plasticity mechanism. However, since the input/output analog voltage signals of νMOS circuits are not precise and susceptible to environmental interference, νMOS circuits are not the suitable substitution for the basic logic gate circuits (AND, OR, and NOT) used in digital computational circuits, where the precise voltage states represented by a string of voltage signals, digital high voltage $V_{DD}$ for "1" and digital low voltage $V_{SS}$ for "0", for the circuit input/output voltage signals. Furthermore besides the analog nature of input/output voltage signals for νMOS circuits, the conventional νMOS circuit designs intended for the functions of the combinational logic gate circuits (combinations of AND, OR, and NOT gates) are not very economic for the following two reasons: (1) νMOS circuits 200 having more numbers of transistors and larger transistors, for example the amplifier transistors shown in FIG. 2(*a*), occupy much larger silicon areas than the conventional logic gate circuits for higher IC chip cost, (2) the double-gate fabrication process for the conventional νMOS devices and circuits requires extra floating-gate processing steps (floating-gate process module) for higher chip fabrication cost.

While from the information processing perspective, the analog νMOS circuit can "analogically and logically" analyze the multiple analog input information for the multiple output analog information without going through multiple computational steps, similar to the information processing in biological neural systems known as the one-step "feed-forward" processing scheme. In contrast, the digital computational processors analyzing the inputted digital information rely on multiple steps of computations executed by a set of programmed instructions (algorithms). The power consumption for information extraction by analog νMOS circuits is considered to be much less than that by multiple computational steps in digital circuits driven by a high frequency clock, specially for the high dimensions of multiple-input and multiple-output information processors. To build an efficient information processor with better power consumption, it will be desirable to have νMOS circuits processing the field of multiple input analog signals from sensor arrays for a set of concise information represented by a set of digital data (bit symbols) such that the numbers of computational processing steps for the final information extraction generated by the digital processors can be dramatically reduced. For the purpose, νMOS circuits shall be designed to initially analyze the fields of inputted analog signals and to filter out the unwanted analog signals and noises such that a set of concise digital data signals for the desired information from the field of sensor arrays are generated for minimizing the computational steps in the later digital processing. The great reductions in computational steps of digital processing can save not only the total processing power but also save the large memory space for Random Access Memory (RAM) in digital computing processors.

On the other hand, since the double-gate process technology for the fabrication of the conventional νMOS devices and circuits, specifically developed for the floating-gate non-volatile memory such as EEPROM, NOR flash memory, and NAND flash memory is not compatible with the single-gate CMOS logic process technology specifically developed for the digital circuit fabrication, the incompatible fabrication process is one of the reason to divert the idea of merging those two approaches, i.e., νMOS circuit processors and digital circuit processors, for the best merits of information processor efficiency. The capability to incorporate νMOS circuits with digital circuits in IC chips fabricated with the same CMOS logic process can not only provide the mean to build efficient information processors for varieties of applications but also reduce the total chip fabrication cost. In this invention, we disclose the innovative single-gate νLG (neuron Logic Gate) MOS devices fabricated with industry standard CMOS logic process technology for neuron circuit designs. The circuit design tools such as device SPICE models and circuit simulators developed for industry standard CMOS logic process technology are then available for νLGMOS circuit simulations. The IC chip processors comprising both analog νLGMOS processor circuits and digital processor circuits optimizing power and cost for varieties of applications can be designed and fabricated with industry standard CMOS logic process technology in wafer fabrication facilities. Meanwhile the analog circuit processors built with νLGMOS circuits of the invention inspired by the concepts of biological neural circuit systems from sensory to high levels of consciousness (neural feed-forward systems), and the memory/decision systems (neural feedback loops) can be explored, simulated, fabricated for IC chips for the applications of biomedical fields.

In one aspect of this invention to demonstrate the fruitful applications of the analog processors built with νLGMOS circuits, we apply the νLGNMOS (neuron Logic Gate N-type Metal Oxide Semiconductor), νLGPMOS (neuron Logic Gate P-type Metal Oxide Semiconductor), and νLGCMOS (neuron Logic Gate Complementary Metal Oxide Semiconductor) circuits to generate the sigmoidal voltage functions, which are the basic activation functions for neural network simulations in computational neuroscience. The sigmoidal functions are introduced for the neural activation behaviors in the neural network simulations, specially for the multiple inputs and multiple layers of training neural networks known as Deep Neural Network (DNN) in machine learning for Artificial Neural Network (ANN) algorithms. In fact, the approximation function theorem have been mathematically proven by Cybenko that multi-layer feed-forward networks with a hidden layer and sigmoidal activation function are universal function approximators (Cybenko, G (1989). "approximation by superpositions of a sigmoidal function". Mathematics of Control, Signals, and Systems. 2 (4): pp. 303-314). This indicates that any given function can be approximated by the neural circuit networks with the sigmoidal function for activation. Since the numeric values of sigmoidal functions in the neural network simulations are generated by digital computations large portions of computing resource are required for the numeric sigmoidal functions in neural network simulations. The numbers of bits applied to the neural network simulations are always the trade-offs between the numeric accuracy and computing resources. Adding a bit for the numeric accuracy of sigmoidal function in the whole neural network simulations will exponentially increase the loading of digital computing resource. Therefore, applying the νLGMOS circuits for sigmoidal voltage function to generate the functional numeric values in IC chips will significantly decrease the loading for digital computing resource in neural network simulations.

In one aspect of this invention, the neural network model simulations for data analysis always involves the re-normalization process for computed binary numeric numbers, where the re-normalization computing process in digital processor consumes huge computing resource. Since the analog voltage signals at the nodes of νLGMOS circuits are always restricted in the range of the high voltage rail $V_a$ and the low voltage $V_s$, the output voltage signals from νLGMOS circuits can be divided into voltage levels for the desired bit accuracy such that the re-normalization process for the numeric values of the sigmoidal functions generated by the νLGMOS circuits is not required for the later neural network simulations in data analysis applications.

In one aspect of this invention, the voltage levels of the output analog voltage signals from νLGMOS circuits can be converted by one or multiple Analog to Digital Converter (ADC) circuits into the digital voltage signals of bit symbol represented by a string of high digital voltage $V_{DD}$ for "1" and low digital voltage $V_{SS}$ for "0" used for digital computations.

In one aspect of this invention, the bit symbols representation for the multiple output analog voltage signals at the multiple output nodes of a νLGMOS circuit can be considered as the responsive voltage state for the given state of inputted voltage signals during a sampling time.

SUMMARY OF THE INVENTION

As used herein and in the claims, the term "double-gate neuron MOS device" refers to a neuron MOS device with input gates and a floating gate formed above the substrate, such as the devices shown in FIGS. 1(*a*) and 3(*a*). The term "single-gate neuron MOS device" refers to a neuron MOS device with a floating gate formed above the substrate and input gates embedded in the substrate, such as the device shown in FIG. 3(*b*). Here, the neuron MOS device is a floating gate device that utilizes multiple input gates to control the voltage on the floating gate so as to control the on/off state of the device. By utilizing the multiple input gates, the neuron MOS device operates much like a biological neuron.

The conventional double-gate N-type νMOS device according to the above disclosure by Shibata et. al fabricated with the double-gate process technology for one layer of input gates 120 and another layer of floating gate 110 is shown in FIG. 1(*a*). The main idea for converting the two layers of double-gate (input gates and a floating gate) νMOS devices 30A into a single layer of νLGMOS devices 30B is to replace the N-type poly-silicon input gates with N-type semiconductor silicon input gates embedded in P-type semiconductor silicon substrate, which is the typical starting silicon substrate for CMOS logic process technology. It is illustrated in FIGS. 3(*a*) and 3(*b*) respectively for the double-gate N-type νMOS device 30A and for the single-gate N-type νLGMOS device 30B that the highly doped N-type ($N^+$) semiconductor forms source region 310 and drain region 320 in the P-type substrate 300 and the P-type channel region 330 under the conducting float gate 340 separated by a layer of gate dielectric 331 with gate capacitance $C_{NM}$. The "n" input gates (35(1), . . . 35(*i*), . . . 35(*n*)) respectively for the double-gate νMOS device 30A and the single-gate νLGMOS device 30B are coupled with the conducting floating gate 340 by a layer of coupling dielectric 341 with the capacitances ($C_1$, $C_2$, . . . , $C_n$). In FIG. 3(*b*), the N-type semiconductor input gates (35(1), . . . 35(*i*), . . . 35(*n*)) embedded inside the P-substrate 300 are electrically insulated each others from the sides surrounded by field isolation dielectrics 360 and the bottoms by the N/P junctions 370 formed by N-type semiconductor and P-type substrate for the N-type νLGMOS device 30B. FIGS. 3(*c*) and 3(*d*) respectively show two equivalent circuit topology for the correspondent circuit schematics for the double-gate N-type νMOS device 30A and the single-gate N-type νLGNMOS device 30B.

To be compatible with CMOS logic circuits, we apply the single-gate N-type νLGNMOS device with a pull-up loading element, the single-gate P-type νLGPMOS device with a pull-down loading element, and the single-gate complementary νLGCMOS device to construct the νLGMOS circuits for generating the inverted sigmoidal voltage function. The inverted sigmoidal voltage function can be considered as the inhibitory activation functions correspondent to the neuron inhibitory firing behavior, while the sigmoidal voltage function used for neural network simulations are the excitatory activation functions correspondent to the neuron excitatory firing behavior. The inverted sigmoidal voltage function can be converted into the sigmoidal voltage function by inverting its output voltage through a CMOS inverter.

In FIG. 4, the inhibitory νLGNMOS circuit 400 comprises the series-connection of a single-gate N-type νLGNMOS device 410 and a loading element 420 biased between the high voltage rail $V_a$ and the ground voltage $V_S$. The drain electrode 413 of the N-type νLGNMOS device 410 with source electrode 411 and p-substrate electrode 412 tied to the ground potential $V_s=0$, is connected with the node 422 of the loading element 420 with the other node 421 biased at the high voltage rail $V_a$ to form the output node 422. The floating-gate 414 is coupled with the MOS device 410 with capacitance $C_{NM}$, and the input gate electrodes 415(1), . . . , 415(*n*) with the capacitances ($C_{s1}$, . . . $C_{sn}$), respectively. The voltage potential $V_f$ of the floating-gate 414 is given by $$V_f=\left(\frac{C_{s1}}{C_T}\right)V_{s1}+\ldots+\left(\frac{C_{sn}}{C_T}\right)V_{sn}+\left(\frac{C_{NM}}{C_T}\right)V_S(=0),$$

where ($V_{s1}$, . . . $V_{sn}$) are the applied input gate voltages and $C_T$ is the total coupling capacitance of the channel region and the input gate electrodes 415(1), . . . , 415(*n*) relative to floating-gate 414 given by $C_T=C_{s1}+\ldots+C_{sn}+C_{NM}$. The output voltage $V_o$ at the node 413 (422) is obtained from the voltage transfer function of $V_o=f(V_f)$ for the floating-gate voltage $V_f$ of the N-type νLGNMOS device 410 series-connected with the loading element 420. The N-type νLGNMOS circuit 400 is turned on with the floating-gate voltage $V_f$ greater than νLGNMOS device's threshold voltage $V_t$ no to pull down the output voltage $V_o$ toward the ground voltage. The output voltage $V_o$ is between the high voltage rail $V_a$ and the ground voltage $V_S$. For example, FIG. 5 shows the voltage transfer function $V_0=f(V_f)$ of the floating-gate voltage $V_f$ versus the output voltage potential $V_o$ for the N-type νLGNMOS threshold voltages of $V_{th0}$ (curve 500), $V_{th1}$ (curve 501), $V_{th2}$ (curve 502) for $V_{th0}<V_{th1}<V_{th2}$ with the load element 420 of an N-type diode-connected MOSFET device, where $V_{lth}$ is the N-type MOSFET threshold voltage for the loading element device 420. Note that the loading element device 420 includes, but is not limited to, a resister, a diode-connected MOSFET device, or a biased MOSFET device for the current to flow through the N-type νLGMOS device 410 to pull down the output voltage potential $V_0$ from the high voltage ($V_a-V_{lth}$) toward the ground voltage $V_S$. The voltage transfer function for the inhibitory νLGNMOS circuit 400 with the pull-up diode-connected NMOSFET device load is the inverted sigmoidal voltage function with the input voltage variable given by $$V_f=\left(\frac{C_{s1}}{C_T}\right)V_{s1}+\ldots+\left(\frac{C_{sn}}{C_T}\right)V_{sn}+\left(\frac{C_{NM}}{C_T}\right)V_S(=0).$$

Furthermore, since the floating-gate 414 of νLGNMOS device 410 is electrically isolated from external electrodes, placing electrical charges in the isolating floating-gate of the νLGNMOS device 410 will cause the voltage transfer function curves (500, 501, 502) to parallel shift as illustrated in FIG. 5. According to the charge conservation law for the floating-gate, the right-shifted voltage ΔV for the negative charged electrons (curves 501 and 502) from the intrinsic voltage transfer function curve 500 (no charge on the floating-gate 414) is given by $\Delta V=-q/(C_{s1}+\ldots+C_{sn})$, where q is the amount of stored charges in the floating-gate 414 and ($C_{s1}+\ldots+C_{sn}$) is the total capacitance of input gate electrodes 415(1), . . . , 415(*n*) relative to the floating-gate 414. The shifted voltage ΔV is the functional bias variable for the inverted sigmoidal function.

In FIG. 6, the inhibitory P-type νLGPMOS circuit 600 comprises the series-connection of a single-gate P-type νLGPMOS device 610 and a load element 620 biased between the high voltage rail $V_a$ and the ground voltage $V_S$. The drain electrode 613 of the P-type νLGMOS device 610 with source electrode 611 and N-type well electrode 612 biased at the high voltage rail $V_a$, is connected with the node 622 of a load element 620 with other node 621 tied to the ground voltage $V_s$ to form the output node 613. The floating-gate 614 is coupled with the P-type νLGMOS device with capacitance $C_{PM}$, and the input gate electrodes 615(1), . . . , 615(*n*) with the capacitances ($C_{s1}$, . . . , $C_{sn}$), respectively. The voltage potential $V_f$ for the floating-gate 614 is given by $$V_f=\left(\frac{C_{s1}}{C_T}\right)V_{s1}+\ldots+\left(\frac{C_{sn}}{C_T}\right)V_{sn}+\left(\frac{C_{PM}}{C_T}\right)V_a=$$

-continued $$\left(\frac{C_{s1}}{C_T}\right)(V_{s1}-V_a)+\ldots+\left(\frac{C_{sn}}{C_T}\right)(V_{sn}-V_a)+V_a,$$

where ($V_{s1}$, . . . $V_{sn}$) are the applied input gate voltages and $C_T$ is the total coupling capacitance of the channel region and the input gate electrodes 615(1), . . . , 615(*n*) relative to the floating gate 614 given by $C_T=C_{s1}+\ldots+C_{sn}+C_{PM}$.

The output voltage $V_o$ at the node 613 (622) is obtained according to the voltage transfer function $V_0=f(V_f)$ for the floating-gate voltage $V_f$ of the P-type vLGPMOS device 610 series-connected with the load element 620. The inhibitory P-type vLGPMOS circuit 600 is turned on for the floating gate voltage $V_f$ less than the voltage ($V_a-V_{th}$) for the P-type vMOS device's threshold voltage $V_th$ to pull up the output voltage $V_o$ toward the high voltage rail $V_a$ from the diode-connected NMOSFET device's threshold voltage $V_{lth}$. The output voltage $V_o$ is between the high voltage rail $V_a$ and the ground voltage $V_S$. For example, FIG. 7 shows the voltage transfer function of the floating-gate voltage $V_f$ versus the output voltage potential $V_o$ for the P-type vLGPMOS threshold voltages of $V_{th0}$ (curve 700), $V_{th1}$ (curve 701), $V_{th2}$ (curve 702), for $V_{th0}<V_{th1}<V_{th2}$ with the load element 620 of an N-type diode-connected MOSFET device, where $V_{lth}$ is the N-type MOSFET threshold voltage for the loading element device 620. Note that the load element device 620 includes, but is not limited to, a resister, a diode-connected MOSFET device, or a biased MOSFET for the current to flow through the P-type vLGMOS device to pull up the output voltage potential $V_o$ from the low voltage $V_{lth}$ toward the high voltage rail $V_a$. Therefore the voltage transfer function for the inhibitory vLGPMOS circuit 600 with the pull-down diode-connected NMOSFET device load is the inverted sigmoidal voltage function with the input voltage variable given by $$V_f=\left(\frac{C_{s1}}{C_T}\right)V_{s1}+\ldots+\left(\frac{C_{sn}}{C_T}\right)V_{sn}+\left(\frac{C_{PM}}{C_T}\right)V_a=\left(\frac{C_{s1}}{C_T}\right)(V_{s1}-V_a)+\ldots+\left(\frac{C_{sn}}{C_T}\right)(V_{sn}-V_a)+V_a.$$

Furthermore, since the floating-gate 614 of vLGPMOS device 610 is electrically isolated from external electrodes, placing electrical charges in the isolating floating-gate 614 of the vLGPMOS device will cause the voltage transfer function curves (700, 701, 702) to parallel shift as illustrated in FIG. 7. According to the charge conservation law for the floating-gate, the right-shifted voltage ΔV for the negative charged electrons (curves 701 and 702) from the intrinsic voltage transfer function curve 700 (no charge on the floating-gate) is given by $\Delta V=-q/(C_{s1}+\ldots+C_{sn})$, where q is the amount of stored charges in the floating-gate and ($C_{s1}+\ldots+C_{sn}$) is the total capacitance of input gate electrodes 615(1), . . . , 615(*n*) relative to the floating-gate 614. The shifted voltage ΔV is the functional bias variable for the inverted sigmoidal function.

In FIG. 8 the inhibitory vLGCMOS circuit device 800 comprises the floating-gate inverter device 850 with the series-connection of single-gate P-type vLGPMOS device 810 and single-gate N-type vLGNMOS device 820. The drain electrode 815P of the P-type vLGPMOS device 810 with source electrode 811 and N-type well electrode 812 biased at the high voltage rail $V_a$ and the drain electrode 815N of the N-type vLGNMOS device 820 with source electrode 813 and P-substrate electrode 814 tied to the ground voltage $V_S(=0)$, are connected to form the output node 815 for the output voltage $V_o$. The conducting floating-gate 816 is capacitively coupled with the vLGCMOS inverter device 850 for the PMOS capacitance $C_{PM}$ and the NMOS capacitance $C_{NM}$, and with the input gate electrodes 817(1), . . . , 817(*n*) for the capacitances ($C_{s1}$, . . . , $C_{sn}$). The voltage potential $V_f$ for the floating-gate 816 is given by $$V_f=\left(\frac{C_{s1}}{C_T}\right)V_{s1}+\ldots+\left(\frac{C_{sn}}{C_T}\right)V_{sn}+\left(\frac{C_{PM}}{C_T}\right)V_a+\left(\frac{C_{NM}}{C_T}\right)V_S(=0),$$

where ($V_{s1}$, . . . , $V_{sn}$) are the applied input gate voltages and $C_T$ is the total coupling capacitance of two channel regions and the input gate electrodes 817(1), . . . , 817(*n*) relative to floating-gate 816 given by $C_T=C_{s1}+\ldots+C_{sn}+C_{PM}+C_{NM}$.

The output voltage $V_o$ at the output node 815 is obtained according to the voltage transfer function $V_0=f(V_f)$ for the floating-gate voltage $V_f$ of the vLGCMOS inverter device 850. The characteristics of voltage transfer function (curve 900) for an CMOS inverter device 850 is therefore the inverted sigmoidal voltage function shown in FIG. 9. Meanwhile since the floating-gate 816 of the vLGCMOS inverter device 850 is electrically isolated from the external electrodes, placing electrical charges in the isolating floating-gate 816 of the vLGCMOS inverter device 850 will cause the voltage transfer function curves (901, 902, 903) to parallel shift as illustrated in FIG. 9. According to the charge conservation law for the floating-gate, the shifted voltage ΔV from the intrinsic voltage transfer function curve 900 (no charge on the floating-gate) is given by $\Delta V=-q/(C_{s1}+\ldots+C_{sn})$, where q is the amount of stored charges in the floating-gate 816 and ($C_{s1}+\ldots+C_{sn}$) is the total capacitance of input gate electrodes 817(1), . . . , 817(*n*) relative to the floating-gate 816. In FIG. 9 for placing electrons (negative charges) in the floating-gate, the voltage transfer function curves right-shift from the zero-charged curve 900 to the curves 901 and 902 for $0<\Delta V_1<\Delta V_2<\Delta V_3$ with $0<-q_1<-q_2<-q_3$. The inverted sigmoidal voltage function generated by the inhibitory vLGCMOS circuit device 800 is the voltage transfer function of the float-gate inverter device 850 with the functional input voltage variable:

$$V_f=\left(\frac{C_{s1}}{C_T}\right)V_{s1}+\ldots+\left(\frac{C_{sn}}{C_T}\right)V_{sn}+\left(\frac{C_{PM}}{C_T}\right)V_a+\left(\frac{C_{NM}}{C_T}\right)V_S(=0),$$

and the voltage bias: $\Delta V=-q/(C_{s1}+\ldots+C_{sn})$.

Those two voltage variables ($V_f$, ΔV) are the functional variables for the inverted sigmoidal functions.

To convert the inhibitory sigmoidal voltage function to the excitatory sigmoidal voltage function, we can add a CMOS inverter device to invert the output voltage signals. For example, the excitatory vLGCMOS circuit 1000 comprises the single-gate vLGCMOS device 1010 and a CMOS inverter device 1020 shown in FIG. 10. The output node 1012 of the vLGCMOS device 1010 having the floating-gate 1016 capacitively coupled with the vLGCMOS inverter device 1010 for the PMOS capacitance $C_{PM}$ and the NMOS capacitance $C_{NM}$, and with the input gate electrodes 1011(1), . . . , 1011(*n*) for the capacitances ($C_{s1}$, . . . , $C_{sn}$), is connected to the input gate 1021 of the CMOS inverter device 1020. Therefore the excitatory sigmoidal voltage functions generated by the excitatory vLGCMOS circuit device 1000 for $V_{th0}$ (curve 1100)$<V_{th1}$ (curve 1101)$<V_{th2}$ (curve 1002) are shown in FIG. 11, where the float-gate voltage potential is given by the functional input voltage variable:

$$V_f = \left(\frac{C_{s1}}{C_T}\right)V_{s1} + \ldots + \left(\frac{C_{sn}}{C_T}\right)V_{sn} + \left(\frac{C_{PM}}{C_T}\right)V_a + \left(\frac{C_{NM}}{C_T}\right)V_S(=0),$$

and the voltage bias: $\Delta V=-q/(C_{s1}+\ldots+C_{sn})$, where q is the amount of stored charges in the floating-gate 1016 and $(C_{s1}+\ldots+C_{sn})$ is the total capacitance of input gate electrodes 1011(1), . . . , 1011(*n*) relative to the floating-gate 1016. Those two voltage variables ($V_f$, $\Delta V$) are the functional variables for the sigmoidal voltage function used in the neural network simulations.

The generic schematic for a processing system with a νLGMOS circuit optimizing for processing efficiency is shown in FIG. 12. The processing system 1200 comprising analog νLGMOS circuit block 1210, Analog-to-Digital Converter (ADC) circuit block 1230, digital inputs 1221, a digital processing circuit 1220, and digital outputs 1222 can be fabricated with industry standard CMOS logic process technology for IC chips. Multiple analog voltage signals, ($V_{ia1}, \ldots, V_{ian}$) are inputted to the input nodes 1201 of the analog νLGMOS circuit 1210 to generate the multiple output analog signals, ($V_{oa1}, \ldots, V_{oam}$) at the output nodes 1213, where n and m>=1. Multiple ADC circuits 1230 are then applied to convert the analog voltage signals, ($V_{oa1}, \ldots, V_{oam}$) into bit symbol with digital voltage signals according to the voltage signal levels or their individual resolutions. The voltage signals of the bit symbols represented by the strings of high digital voltage $V_{DD}$ for "1" and low digital voltage $V_{SS}$ for "0" are then fed into the digital inputs 1221. The digital processing circuit 1220 includes a digital processor and a program memory (not shown). When multiple programmed instructions stored in the program memory are executed by the digital processor, the digital processor is configured to perform the digital computations with the inputted digital data from the digital inputs 1221 to output the computed digital data to the digital outputs 1222 at nodes 1202. The digital processor includes, but is not limited to, a general-purpose processor, a special-purpose processor or both.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1(*b*) shows equivalent floating gate capacitances of the conventional neuron MOSFET device in FIG. 1(*a*).

FIG. 2(*b*) shows the relationship among external control signal voltages ($V_A$, $V_B$ and $V_C$) and "analog logic functions" for input gate voltages ($I_1$ and $I_2$).

FIG. 3(*b*) illustrates a cross section view of a single-gate νLGMOS device according to the invention.

FIG. 3(*c*) illustrates a corresponding equivalent circuit of the conventional double-gate νMOS device 300A in FIG. 3(*a*).

FIG. 3(*d*) illustrates a corresponding equivalent circuit of the single-gate νLGMOS device 300B in FIG. 3(*b*).

DETAILED DESCRIPTION OF THE INVENTION

The following detailed description of layouts for the νLGMOS circuit embodiment fabricated with CMOS logic process technology is meant to be illustrative only and not limiting. It is to be understood that other embodiment may be utilized and element changes for various CMOS devices such as the planar devices, FinFet (Fin Field Effect Transistor) devices, and GAA (Gate All Around) devices fabricated with different generations of CMOS logic process technology nodes may be made without departing from the scope of the present invention. Also, it is to be understood that the phraseology and terminology used herein are for the purpose of description and should not be regarded as limiting. Those of ordinary skill in the art will immediately realize that the embodiment of the present invention described herein in the context of methods and schematics are illustrative only and are not intended to be in anyway limiting. Other embodiment of the present invention will readily suggest themselves to such skilled persons having the benefits of this disclosure.

Figure 1A:
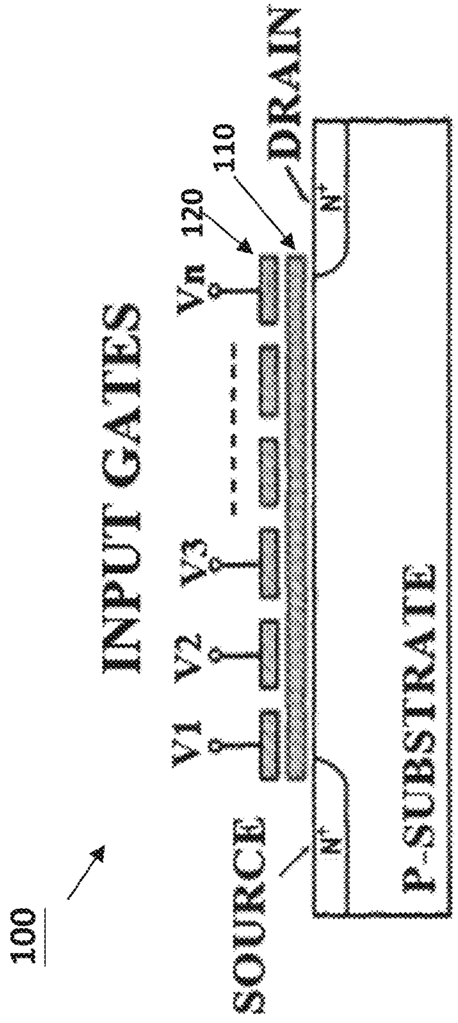
FIG. 1(*a*) shows a cross section view of a traditional double-gate neuron MOS (νMOS) device disclosed in "An intelligent MOS transistor featuring gate-level weighted sum and threshold operations," by Shibata et. al. (page 99 of International Electron Devices meeting (IEDM) 1991).
Figure 1B:
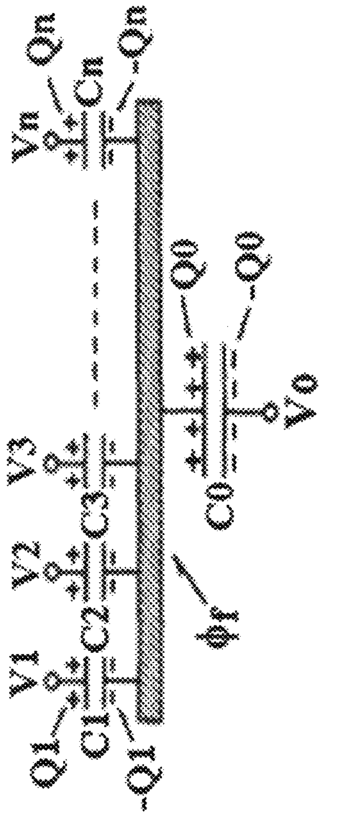
Figures 2A, 2B:
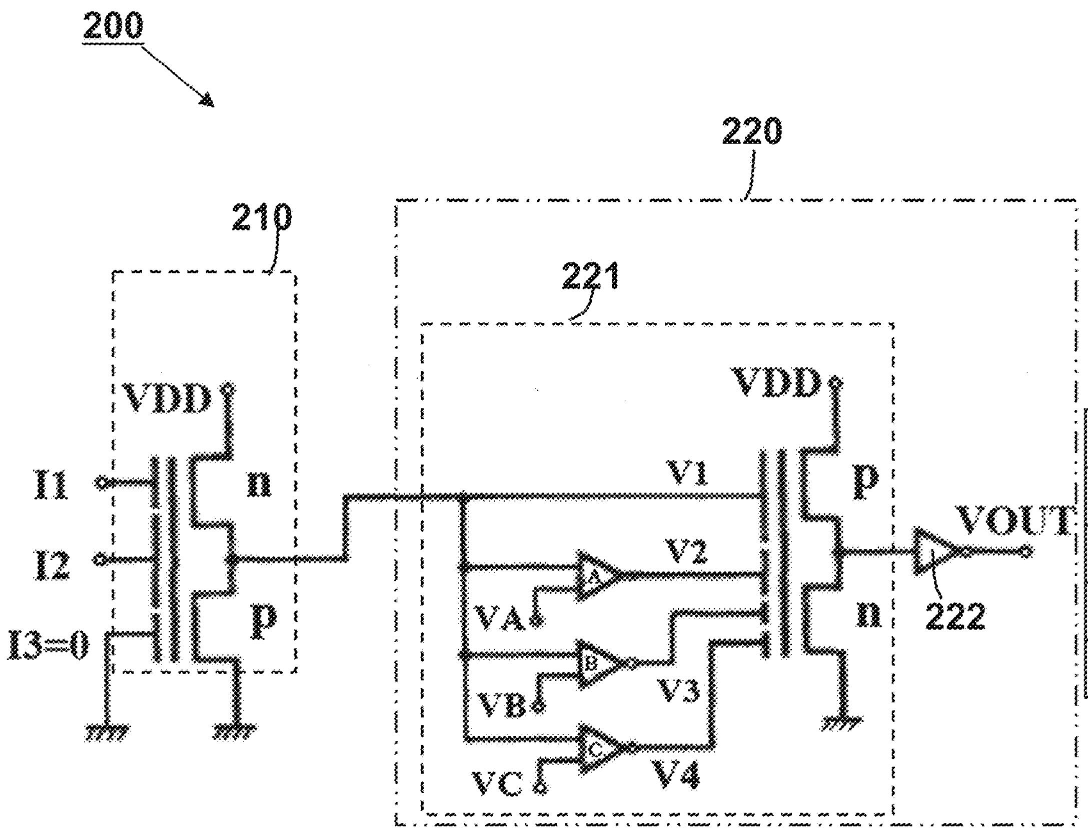
FIG. 2(*a*) is a schematic diagram of a conventional νMOS circuit according to the disclosure "An intelligent MOS transistor featuring gate-level weighted sum and threshold operations," by Shibata et. al.
Figures 3A, 3B, 3C, 3D:
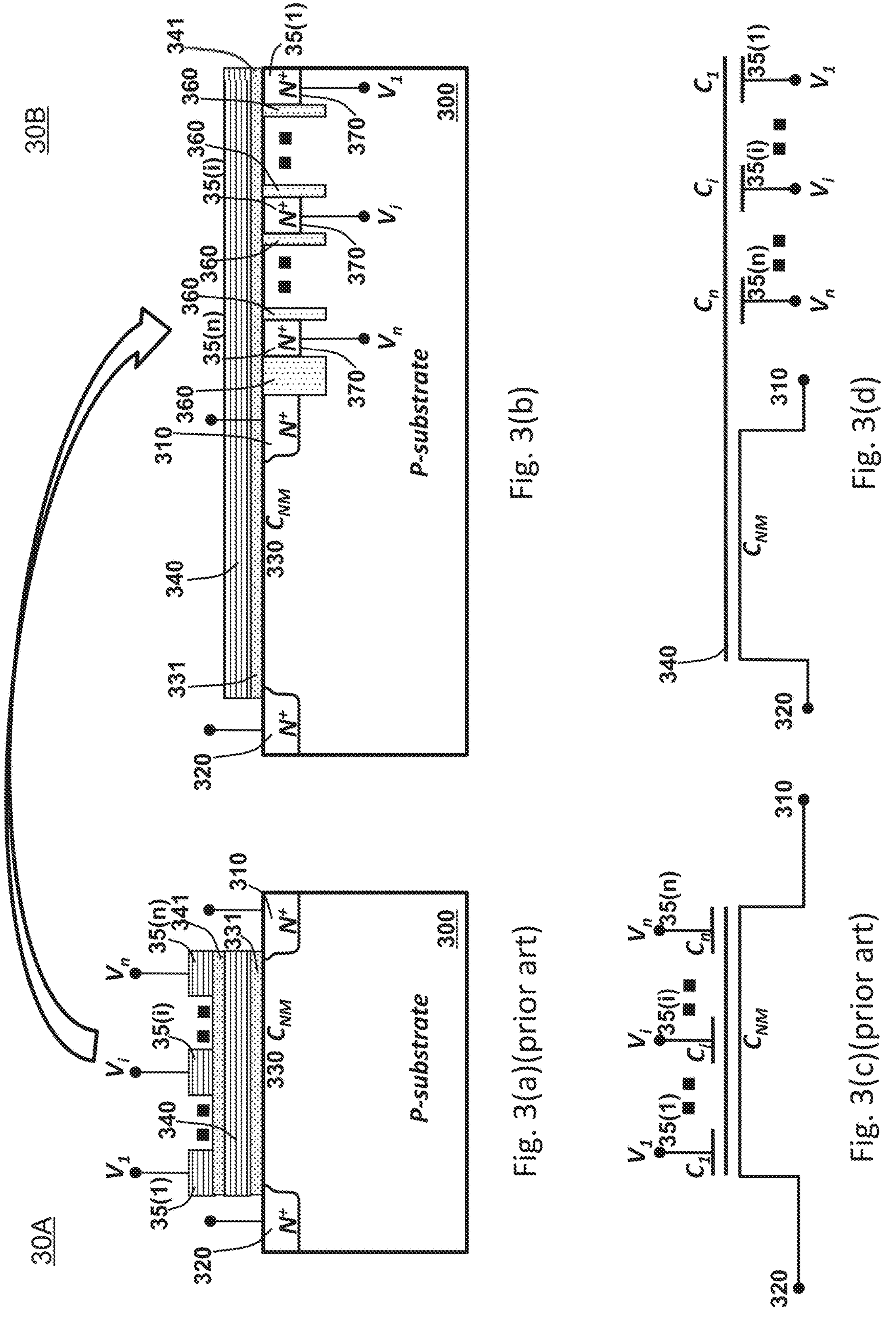
FIG. 3(*a*) illustrates a cross section view of double-gate νMOS device according to the νMOS device 100 in FIG. 1(*a*).
Figure 4:
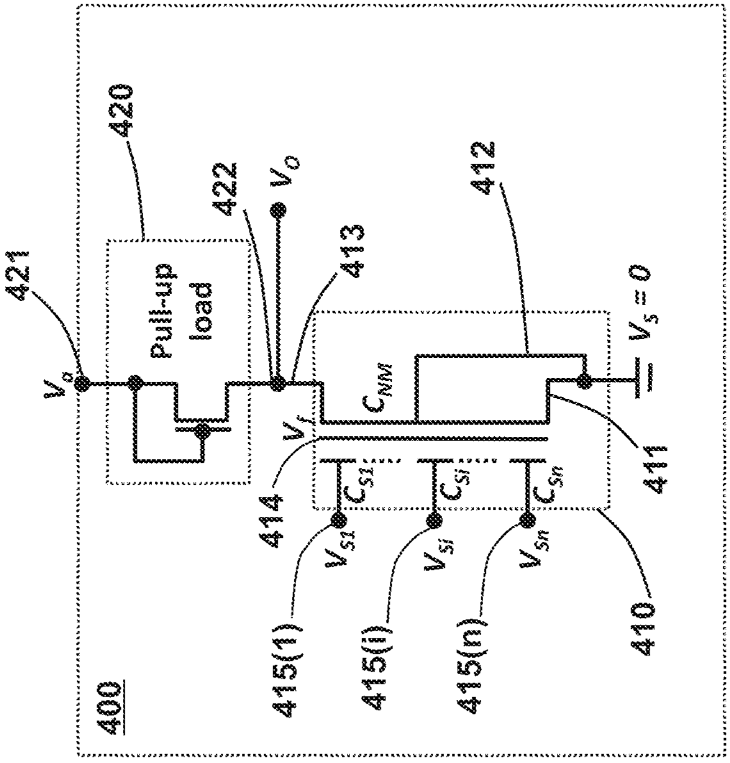
FIG. 4 shows the circuit schematic for the inhibitory N-type νLGNMOS device with a diode-connected NMOSFET device load to generate the inverted sigmoidal voltage function according to the invention.
Figure 5:
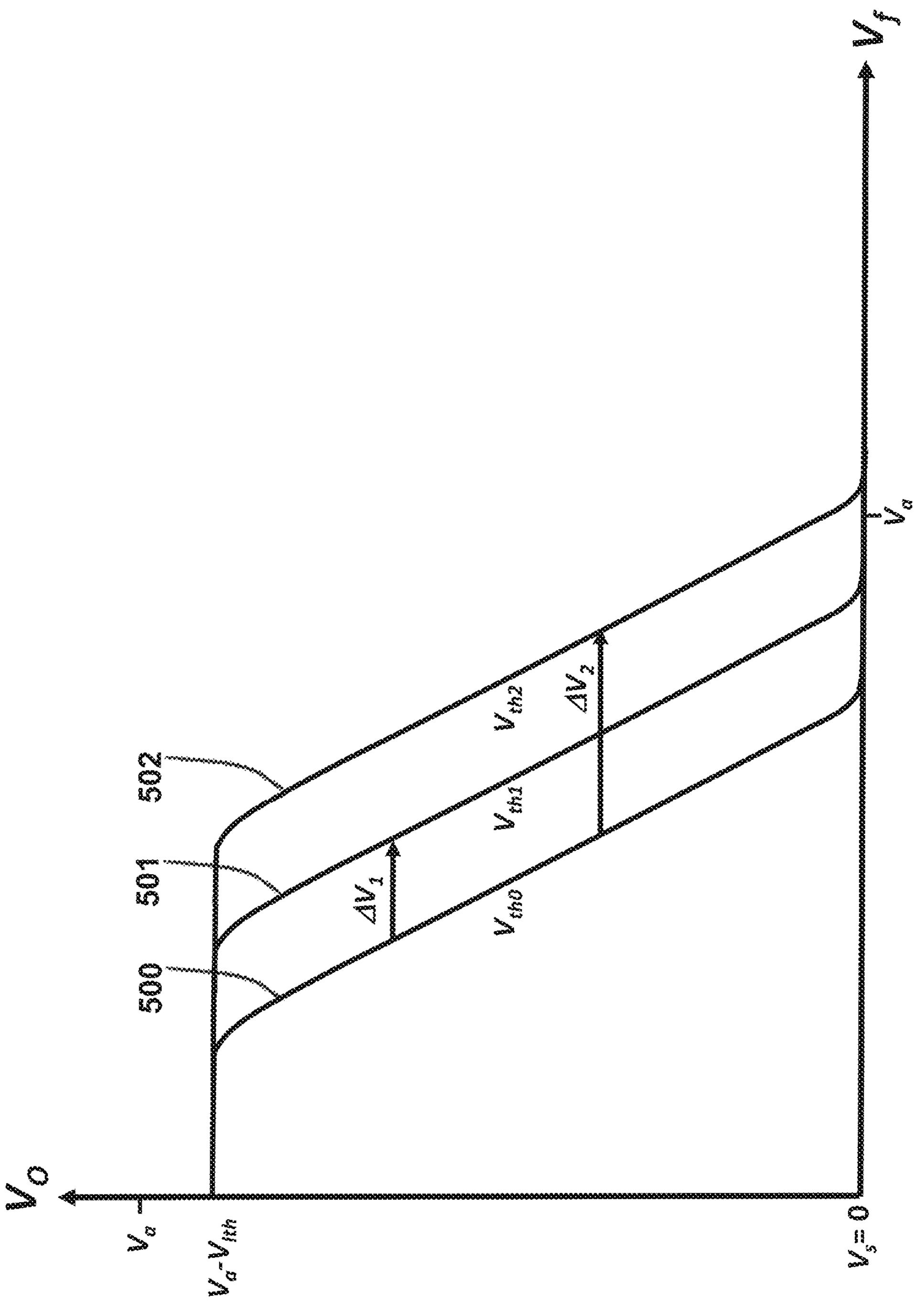
FIG. 5 shows the floating-gate voltage vs. the output voltage for the inverted sigmoidal voltage function generated by the circuit device in FIG. 4.
Figure 6:
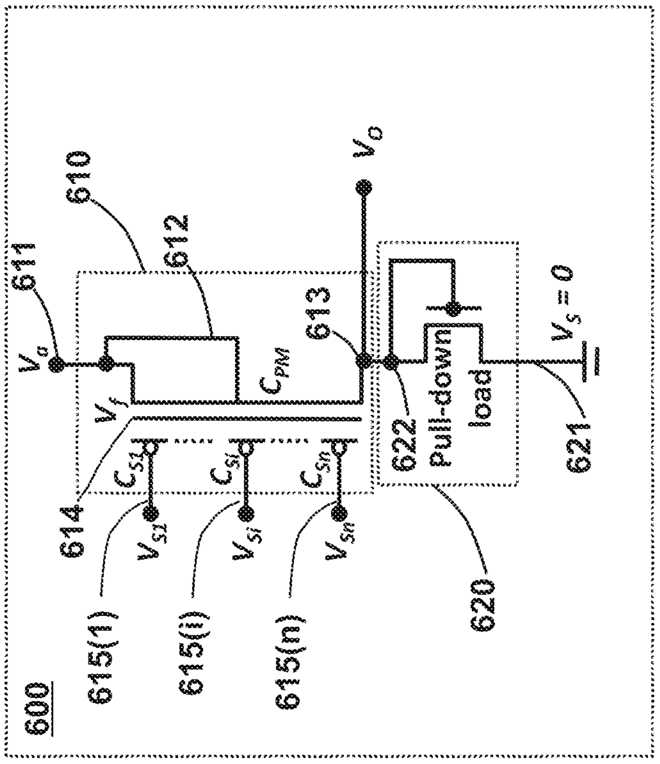
FIG. 6 shows the circuit schematic of the inhibitory P-type νLGPMOS device with a diode-connected NMOSFET device load to generate the inverted sigmoidal voltage function according to the invention.
Figure 7:
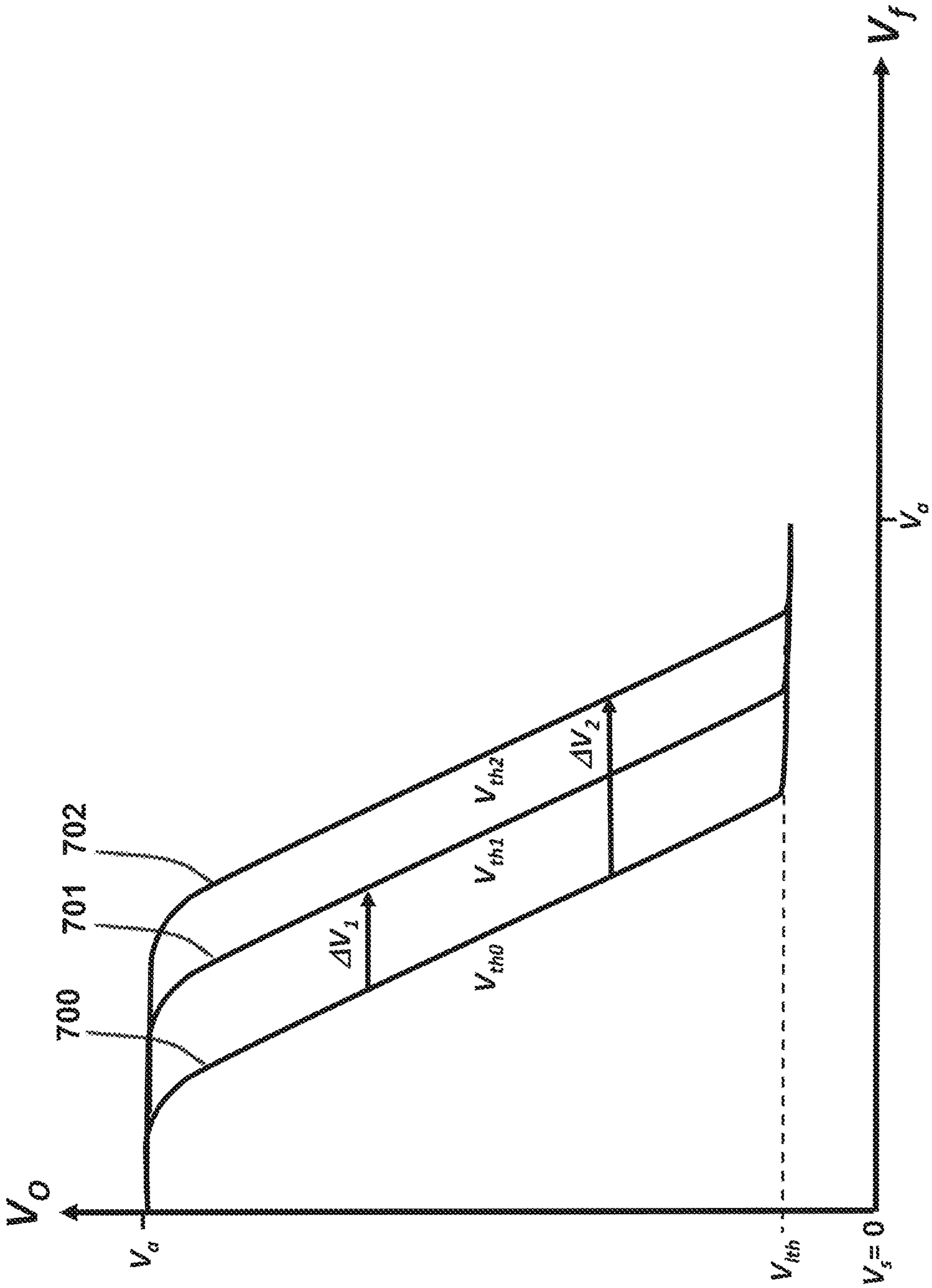
FIG. 7 shows the floating-gate voltage vs. the output voltage for the inverted sigmoidal voltage function generated by the circuit device in FIG. 6.
Figure 8:
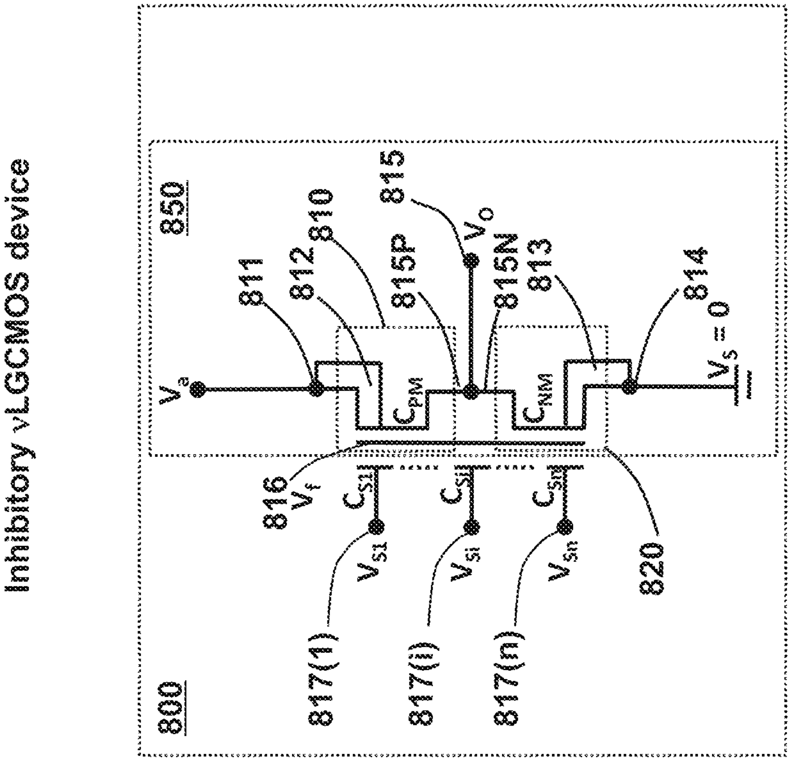
FIG. 8 shows the circuit schematic of the inhibitory complementary νLGCMOS device to generate the inverted sigmoidal voltage function according to the invention.
Figure 9:
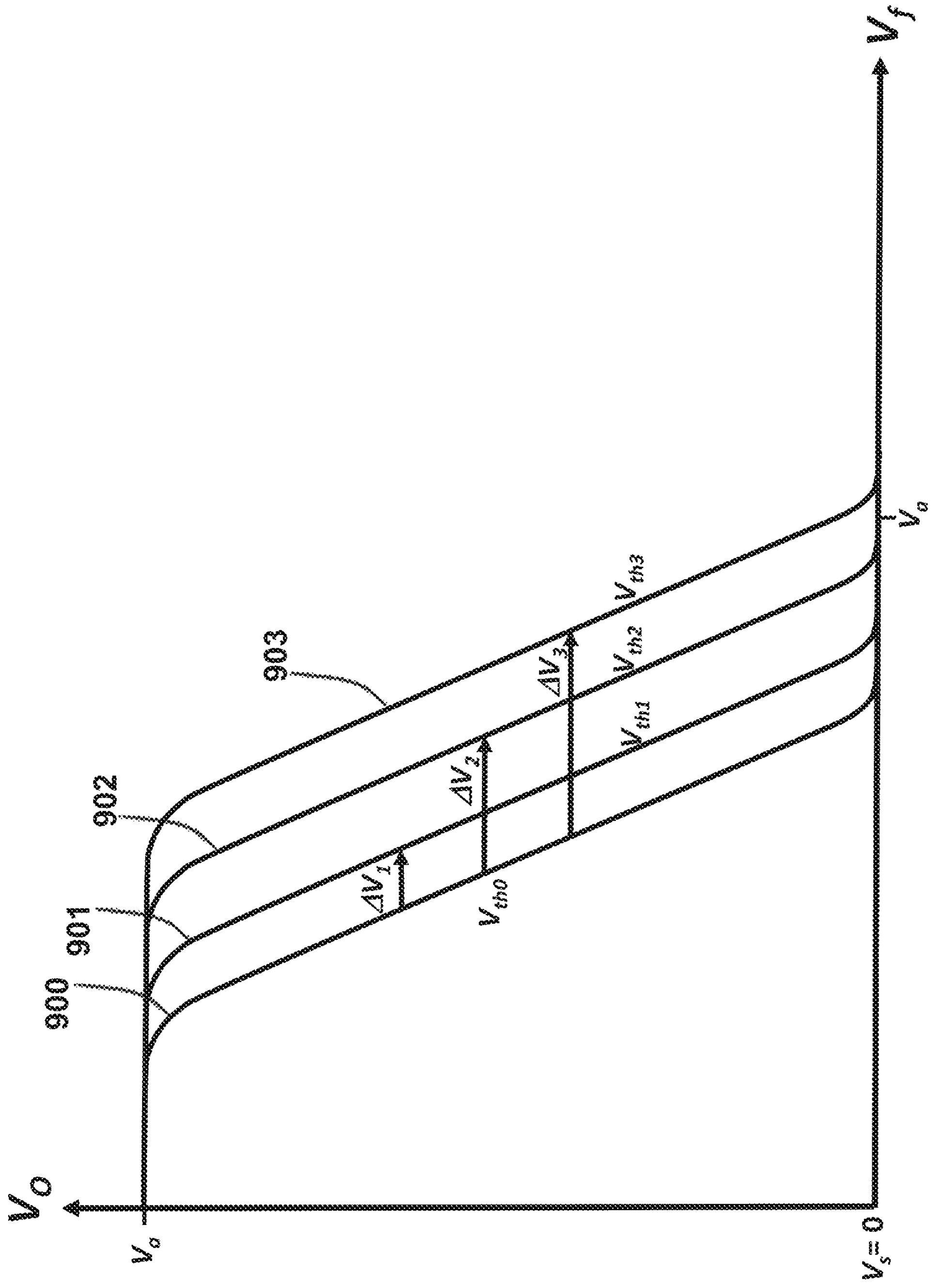
FIG. 9 shows the voltage transfer function of floating-gate voltage vs. the output voltage for the inverted sigmoidal voltage function generated by the circuit device in FIG. 8.
Figure 13:
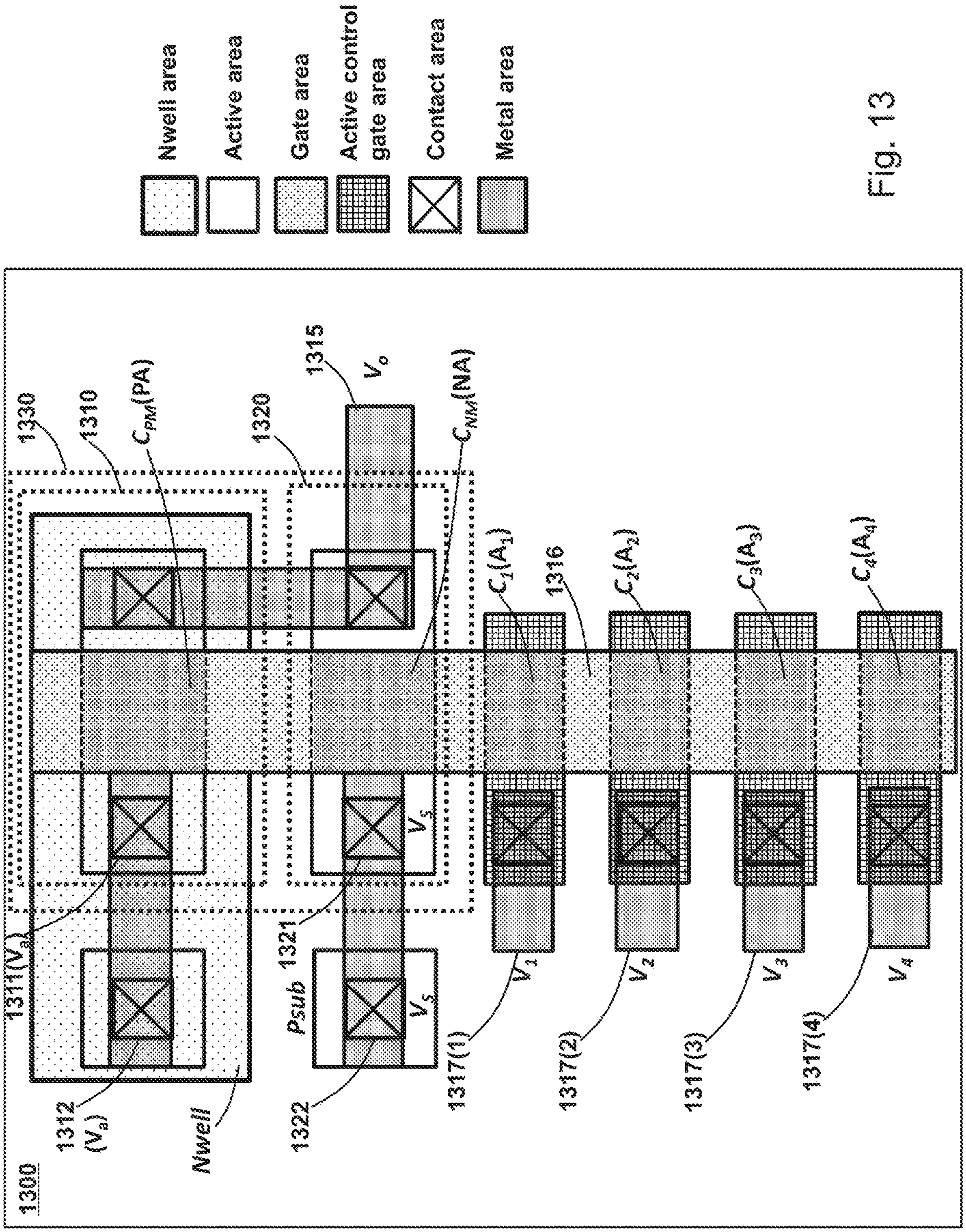
FIG. 13 shows the top view of inhibitory complementary νLGCMOS device with four input gates fabricated with CMOS logic process technology according to one embodiment of the invention.

In one embodiment the top view of inhibitory complementary νLGCMOS circuit device 800 in FIG. 8 with four input gates fabricated with CMOS logic process technology is illustrated in FIG. 13. The inhibitory complementary νLGMOS circuit device 1300 comprises the single-gate P-type νLGPMOS device 1310 with the source electrode 1311 and N-type well electrode 1312 biased at the high voltage rail $V_a$ and the single-gate N-type νLGNMOS device 1320 with the source electrode 1321 and P-substrate electrode 1322 tied to the ground voltage $V_S=0$, respectively. The drain electrodes of the single-gate P-type νLGPMOS device 1310 and the single-gate N-type νLGNMOS device 1320 are connected by metal/contacts to form the output node 1315 for the output voltage $V_o$. The conducting floating-gate 1316 extended from the areas of νLGPMOS device 1310 and νLGNMOS device 1320 to the input electrode areas is capacitively coupled with the floating-gate inverter device 1330 for the PMOS capacitance $C_{PM}$ and the NMOS capacitance $C_{NM}$, and the input gates [1317(1), 1317(2), 1317(3), 1317(4)] for the input electrode capacitances ($C_1$, $C_2$, $C_3$, $C_4$). The voltage potential $V_f$ of the conducting floating-gate 1316 is given by $$V_f = \left(\frac{C_1}{C_T}\right)V_1 + \left(\frac{C_2}{C_T}\right)V_2 + \left(\frac{C_3}{C_T}\right)V_3 + \left(\frac{C_4}{C_T}\right)V_4 + \left(\frac{C_{PM}}{C_T}\right)V_a + \left(\frac{C_{NM}}{C_T}\right)V_S(=0),$$

where ($V_1$, $V_2$, $V_3$, $V_4$) are the applied input gate voltages and $C_T$ is the total coupling capacitance of the two channel regions and the input gate electrodes 1317(1), . . . , 1317(4) relative to the floating-gate 1316 given by $$C_T = C_1 + C_2 + C_3 + C_4 + C_{PM} + C_{NM}.$$

Note that by neglecting the parasitic capacitances, the capacitance ratios can be approximately obtained by the ratios of the floating-gate areas overlapped with the PMOS area (PA), the NMOS area (NA), and the input electrode areas ($A_1$, $A_2$, $A_3$, $A_4$), respectively.

Figure 10:
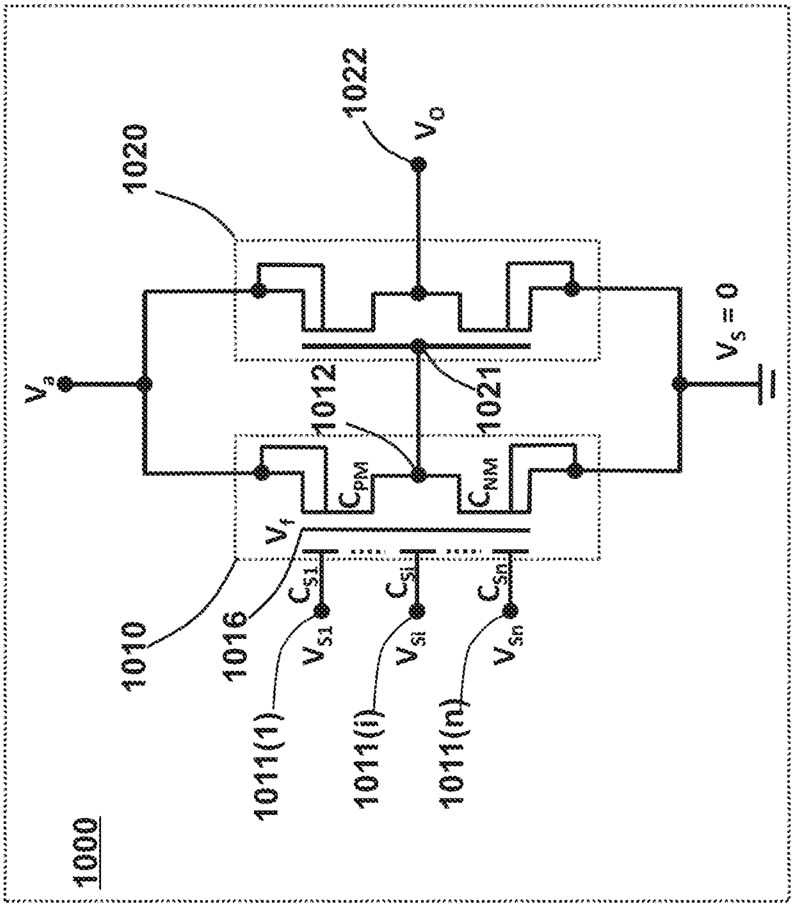
FIG. 10 shows the circuit schematic of the excitatory complementary νLGCMOS device circuit to generate the sigmoidal voltage function according to one embodiment of the invention.
Figure 11:
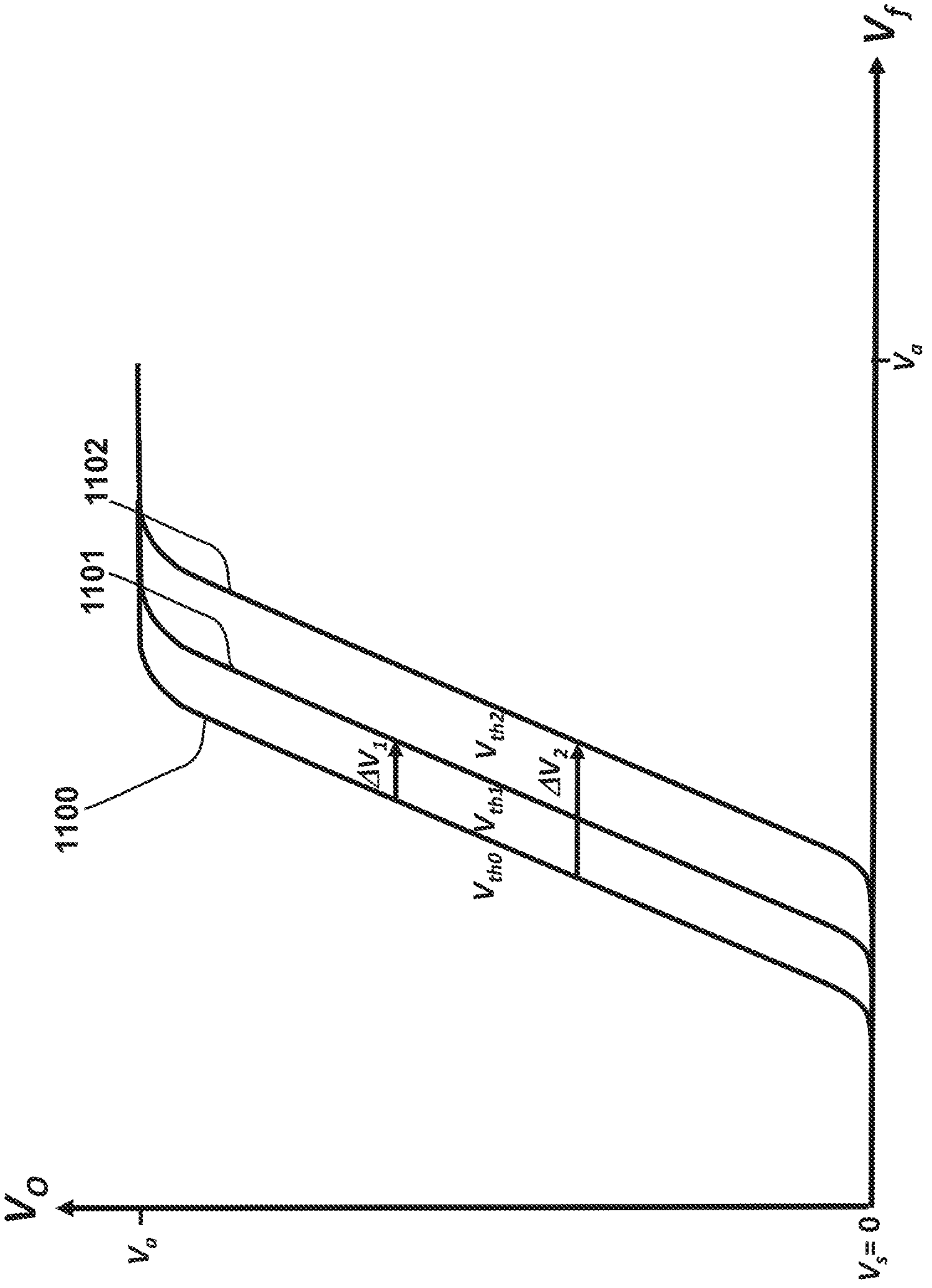
FIG. 11 shows the voltage transfer function of floating-gate voltage vs. the output voltage for the sigmoidal voltage function generated by the circuit device in FIG. 10 according to one embodiment of the invention.
Figure 12:
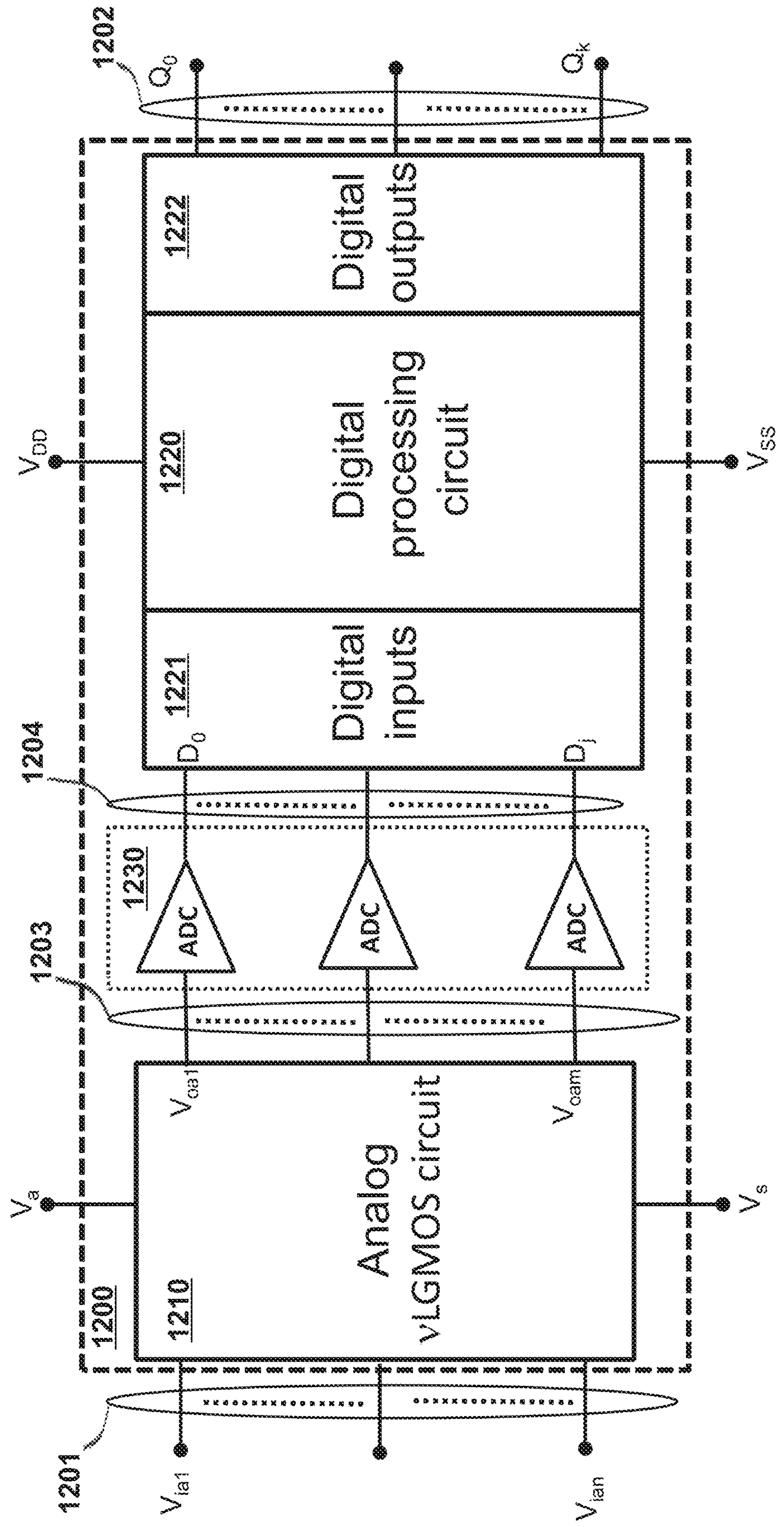
FIG. 12 shows the generic circuit schematic for a processing system with Analog-Digital-Converter (ADC) circuit for connecting the outputs of analog νLGMOS circuits to the inputs of digital processing circuit according to one embodiment of the invention.
Figure 14:
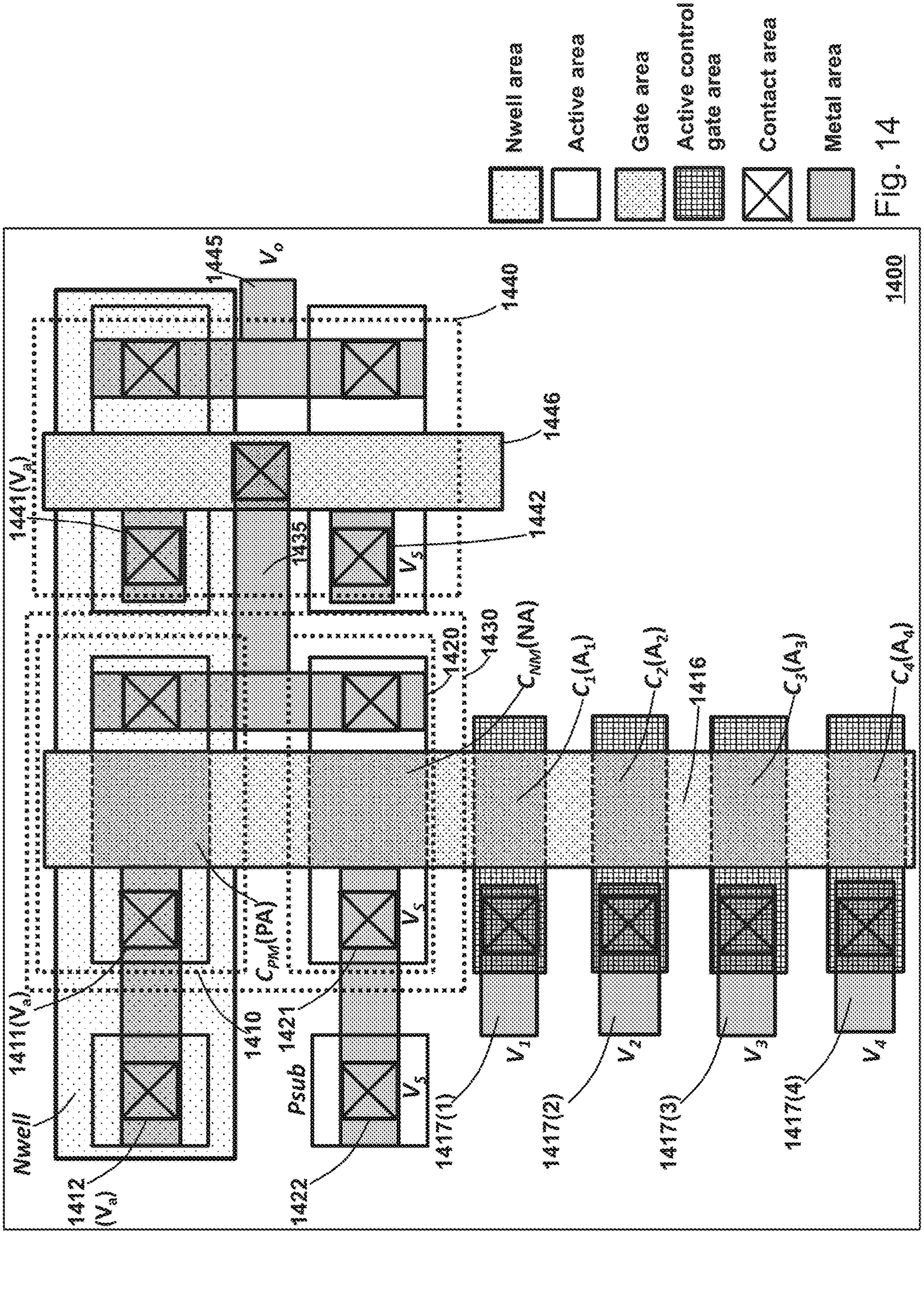
FIG. 14 shows the top view of excitatory complementary νLGCMOS circuit device with four input gates fabricated with CMOS logic process technology according to one embodiment of the invention.

In one embodiment, the top view of excitatory complementary νLGCMOS circuit device 1000 in FIG. 10 with four input gates fabricated with CMOS logic process technology is illustrated in FIG. 14. The excitatory complementary νLGCMOS circuit device 1400 comprises the single-gate νLGCMOS inverter 1430 with series-connection of single-gate P-type νLGMOS device 1410 and single-gate N-type νLGMOS device 1420, and the CMOS inverter 1440 with the input gate 1446 and the P-source electrodes 1441 and N-source electrode 1442, where the P-source electrodes 1441 and N-source electrode 1442 are respectively biased to $V_a$ and the ground voltage $V_S$. The output node 1435 of the νLGCMOS inverter 1430 is connected to the input gate 1446 of the conventional CMOS inverter 1440 for inverting the output voltage signal from the νLGCMOS inverter 1430 to the output voltage signals $V_o$ at the output node 1445. The conducting floating-gate 1416 extended from the areas of νLGPMOS device 1410 and νLGNMOS device 1420 to the input electrode areas is capacitively coupled with the floating-gate inverter device 1430 for the PMOS capacitance $C_{PM}$ and the NMOS capacitance $C_{NM}$, and the input gates [1417(1), 1417(2), 1417(3), 1417(4)] for the input electrode capacitances ($C_1$, $C_2$, $C_3$, $C_4$), respectively. The voltage potential $V_f$ of the conducting floating-gate 1416 is given by $$V_f = \left(\frac{C_1}{C_T}\right)V_1 + \left(\frac{C_2}{C_T}\right)V_2 + \left(\frac{C_3}{C_T}\right)V_3 + \left(\frac{C_4}{C_T}\right)V_4 + \left(\frac{C_{PM}}{C_T}\right)V_a + \left(\frac{C_{NM}}{C_T}\right)V_S(=0),$$

where ($V_1$, $V_2$, $V_3$, $V_4$) are the applied input gate voltages and $C_T$ is the total coupling capacitance of two channel regions and the input gate electrodes 1417(1), . . . , 1417(4) relative to the floating-gate 1416 given by $$C_T = C_1 + C_2 + C_3 + C_4 + C_{PM} + C_{NM}.$$

Note that by neglecting the parasitic capacitances, the capacitance ratios can be approximately obtained by the ratios of the floating-gate areas overlapped with the PMOS area (PA), the NMOS area (NA) and the electrode areas ($A_1$, $A_2$, $A_3$, $A_4$), respectively.

The aforementioned description of the preferred embodiment of the invention has been presented for purposes of illustration and description. It is not intended to be exhaustive or to limit the invention to the precise form or to exemplary embodiment disclosed. Accordingly, the description should be regarded as illustrative rather than restrictive. The embodiment is chosen and described in order to best explain the principles of the invention and its best mode practical application, thereby to enable persons skilled in the art to understand the invention for various embodiment and with various modifications as are suited to the particular use or implementation contemplated. It is intended that the scope of the invention be defined by the claims appended hereto and their equivalents in which all terms are meant in their broadest reasonable sense unless otherwise indicated. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiment of the invention. It should be appreciated that variations may be made in the embodiment described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A processing system for receiving multiple input analog voltages and generating one or more digital outputs, comprising:

analog circuitry comprising at least one MOS circuit, each of which comprises a first single-gate neuron MOS device comprising multiple input gates, wherein each MOS circuit is configured to model one of a sigmoid function and an inverted sigmoid function that produces an output analog voltage in response to one or more of the multiple input analog voltages applied to the multiple input gates;

conversion circuitry coupled to the analog circuitry and comprising one or more analog-to-digital converters (ADCs), each ADC performing analog to digital conversion over a corresponding output analog voltage according to an individual resolution to generate a digital value; and a digital processor configured to perform digital processing operations over one or more digital values from the conversion circuitry to generate the one or more digital outputs;

wherein the analog circuitry, the conversion circuitry and the digital processor are fabricated with industry standard CMOS logic process technology for one or more integrated circuit chips.

2. The system according to claim 1, wherein a range of the output analog voltage is limited to two different operating voltages carried by an operating voltage terminal and a ground voltage terminal that are coupled to the analog circuitry.

3. The system according to claim 1, wherein one of the at least one MOS circuit is configured to model the inverted sigmoid function and comprises:

a loading element; and the first single-gate neuron MOS device that is series-connected to the loading element via an output node that generates the output analog voltage.

4. The system according to claim 3, wherein the inverted sigmoid function is the output analog voltage at the output node as a function of a voltage potential of a floating gate of the first single-gate neuron MOS device in the one of at least one MOS circuit.

5. The system according to claim 4, wherein the voltage potential of the floating gate is associated with the one or more of the multiple input analog voltages, two different operating voltages for the analog circuitry and capacitances of the multiple input gates and a channel region of the first single-gate neuron MOS device relative to the floating gate.

6. The system according to claim 1, wherein one of the at least one MOS circuit is configured to model the inverted sigmoid function and comprises:

the first single-gate neuron MOS device; and a second single-gate neuron MOS device, wherein the first and the second single-gate neuron MOS devices are connected in series to form a single-gate neuron CMOS device;

wherein the single-gate neuron CMOS device comprises the multiple input gates, a floating gate, a first channel region and a second channel region.

7. The system according to claim 6, wherein the inverted sigmoid function for the one of the at least one MOS circuit is the output analog voltage at an output node of the single-gate neuron CMOS device as a function of a voltage potential of the floating gate.

8. The system according to claim 7, wherein the voltage potential of the floating gate is associated with the one or more of the multiple input analog voltages, two different operating voltages for the analog circuitry and capacitances of the multiple input gates and the first and the second channel regions relative to the floating gate.

9. The system according to claim 1, wherein one of the at least one MOS circuit is configured to model the sigmoid function and comprises:

the first single-gate neuron MOS device;

a second single-gate neuron MOS device, wherein the first and the second single-gate neuron MOS devices are connected in series to form a single-gate neuron CMOS device; and a CMOS inverter, wherein an input node of the CMOS inverter is connected to an output node of the single-gate neuron CMOS device and an output node of the CMOS inverter generates the output analog voltage.

10. The system according to claim 9, wherein the single-gate neuron CMOS device comprises the multiple input gates, a floating gate, a first channel region and a second channel region, wherein the sigmoid function for the one of the at least one MOS circuit is the output analog voltage at the output node of the CMOS inverter as a function of a voltage potential of the floating gate, and wherein the voltage potential of the floating gate is associated with the one or more of the multiple input analog voltages, two different operating voltages for the analog circuitry and capacitances of the multiple input gates and the first and the second channel regions relative to the floating gate.

11. The system according to claim 1, wherein the first single-gate neuron MOS device is formed in a substrate of a first conductivity type and comprises:

a source region of a second conductivity type formed in the substrate;

a drain region of the second conductivity type formed in the substrate;

a channel region defined between the source region and the drain region;

the multiple input gates of the second conductivity type formed in the substrate; and a floating gate disposed over and insulated from both the channel region and the multiple input gates.

12. The system according to claim 11, wherein for one of the at least one MOS circuit, a right-shift amount of a present voltage transfer curve relative to an intrinsic voltage transfer curve is determined by an amount of charges stored in the floating gate and a total capacitance of the multiple input gates relative to the floating gate;

wherein the present voltage transfer curve is equivalent to the one of the sigmoid function and the inverted sigmoid function; and wherein the intrinsic voltage transfer curve corresponds to the one of the at least one MOS circuit with no electrons stored in the floating gate of the first single-gate neuron MOS device.

13. The system according to claim 1, wherein the analog circuitry is simulated and fabricated for the one or more integrated circuit chips in applications of biomedical fields.

* * * * *